United States Patent

Hasegawa et al.

(10) Patent No.: US 9,953,800 B2
(45) Date of Patent: Apr. 24, 2018

(54) MULTI-CHARGED PARTICLE BEAM WRITING APPARATUS AND MULTI-CHARGED PARTICLE BEAM WRITING METHOD

(71) Applicant: NuFlare Technology, Inc., Yokohama-shi (JP)

(72) Inventors: Kei Hasegawa, Yokohama (JP); Hayato Kimura, Suntou-gun (JP); Hideo Inoue, Miura-gun (JP); Yoshiaki Onimaru, Yokohama-shi (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/137,290

(22) Filed: Apr. 25, 2016

(65) Prior Publication Data

US 2016/0322196 A1 Nov. 3, 2016

(30) Foreign Application Priority Data

Apr. 28, 2015 (JP) ................. 2015-091846

(51) Int. Cl.
*H01J 37/304* (2006.01)
*H01J 37/04* (2006.01)
*H01J 37/317* (2006.01)

(52) U.S. Cl.
CPC ........ *H01J 37/045* (2013.01); *H01J 37/3177* (2013.01); *H01J 2237/2485* (2013.01); *H01J 2237/31762* (2013.01)

(58) Field of Classification Search
USPC ..................................... 250/492.3
See application file for complete search history.

(56) References Cited

U.S. PATENT DOCUMENTS

| 6,768,125 B2 * | 7/2004 | Platzgummer | ......... B82Y 10/00 250/492.1 |
| 9,269,543 B2 * | 2/2016 | Reiter | .................. H01J 37/045 |

FOREIGN PATENT DOCUMENTS

| JP | 8-337014 | 12/1996 |
| JP | 2007-19246 | 1/2007 |

* cited by examiner

*Primary Examiner* — Phillip A Johnston
(74) *Attorney, Agent, or Firm* — Oblon, McClelland, Maier & Neustadt, L.L.P.

(57) ABSTRACT

According to one embodiment, in a multi-charged particle beam writing apparatus, a blanking plate includes a plurality of first buffers connected in series, second buffers in a plurality of stages connected in series between the first buffer and a blanker, and an error detection processing circuitry performing error detection on data stored in the first buffer and the second buffers. The blanking control data transfers to the corresponding blanker via the first buffer and the second buffers. In a case where the error detection processing circuitry detects an error, the control processing circuitry retransmits the blanking control data to the blanking plate with regard to a shot having the error detected therein and a shot which comes, in a shot order, after the shot having the error detected therein.

13 Claims, 9 Drawing Sheets

MULTI-CHARGED PARTICLE BEAM WRITING APPARATUS AND MULTI-CHARGED PARTICLE BEAM WRITING METHOD

CROSS REFERENCE TO RELATED APPLICATION

This application is based upon and claims benefit of priority from the Japanese Patent Application No. 2015-91846, filed on Apr. 28, 2015, the entire contents of which are incorporated herein by reference.

FIELD

The present invention relates to a multi-charged particle beam writing apparatus and a multi-charged particle beam writing method.

BACKGROUND

With the increasing integration of LSI circuits, the line width in a circuit required for a semiconductor device has become smaller year by year. In order to form a desired circuit pattern on a semiconductor device, a method has been employed in which a highly precise original pattern (which is called a mask, or in particular, a pattern used for a stepper or a scanner also referred to as a reticle) formed on quartz is reduced and transferred onto a wafer by using a reduction projection-type exposure apparatus. The highly precise original pattern is written with an electron beam writing apparatus, and a so-called electron beam lithography technique is used.

For example, a multibeam writing apparatus radiating many beams at a time by using multibeams to improve the throughput has been known as an electron beam writing apparatus. With this multibeam writing apparatus, for example, an electron beam emitted from an electron gun passes through an aperture member having multiple holes, whereby the multibeams are formed, and each beam is controlled to be blanked by a blanking plate (blanking aperture array). A beam that has not been shielded is reduced by an optical system, and the reduced beam is radiated onto a desired position on a mask on which the pattern is to be written.

The blanking plate is provided with a substrate formed with multiple holes, a blanker formed around each hole and deflecting a beam, and a control circuit unit to apply a voltage to the blanker. A calculator converts layout data made by a user into a writing format of a writing apparatus, and generates blanking control data for controlling ON/OFF of each beam. This blanking control data is transferred by the control circuit unit. A deflection voltage based on the transferred blanking control data is applied to the blanker, and the beam is turned ON for a desired period of time.

A transfer error may occur during the transfer processing for transferring the blanking control data performed by the control circuit unit. When the transfer error occurs, ON/OFF of the beam is not correctly controlled, and this reduces the writing precision, which may result in a problem in that a pattern error occurs.

DETAILED DESCRIPTION

In one embodiment, a multi-charged particle beam writing apparatus includes a stage on which a target object is placed and which can continuously move, a discharger discharging a charged particle beam, an aperture member having a plurality of opening portions formed therein and configured to receive radiation of the charged particle beam in an area including all of the plurality of opening portions and to form multibeams when part of the charged particle beam passes through each of the plurality of opening portions, a blanking plate arranged with a plurality of blankers applying a blanking deflection for switching ON/OFF of corresponding beams among the multibeams having passed through the plurality of opening portions of the aperture member, a deflector deflecting the beams having passed through blankers to a writing position of each beam by following movement of the stage, a control processing circuitry generating, for each beam, blanking control data for switching ON/OFF of the beam for each of a plurality of shots, transmitting the blanking control data to the blanking plate, and controlling the deflector so that each beam is deflected to a corresponding writing position, and a memory storing the blanking control data transmitted to the blanking plate. The blanking plate includes a plurality of first buffers corresponding to the blankers and connected in series, second buffers in a plurality of stages connected in series between the first buffer and a blanker corresponding to the first buffer, and an error detection processing circuitry performing error detection on data stored in the first buffer and the second buffer in each of the stages. The blanking control data is configured to be transferred to the corresponding blanker via the first buffer and the second buffers. In a case where the error detection processing circuitry detects an error, the control processing circuitry retransmits the blanking control data to the blanking plate with regard to a shot having the error detected therein and a shot which comes, in a shot order, after the shot having the error detected therein.

An embodiment of the present invention will be hereinafter explained with reference to drawings. In the present embodiment, a configuration will be explained in which an electron beam is used as an example of a charged particle beam. However, the charged particle beam is not limited to the electron beam. Alternatively, the charged particle beam may be a charged particle beam such as an ion beam.

Figure 1:
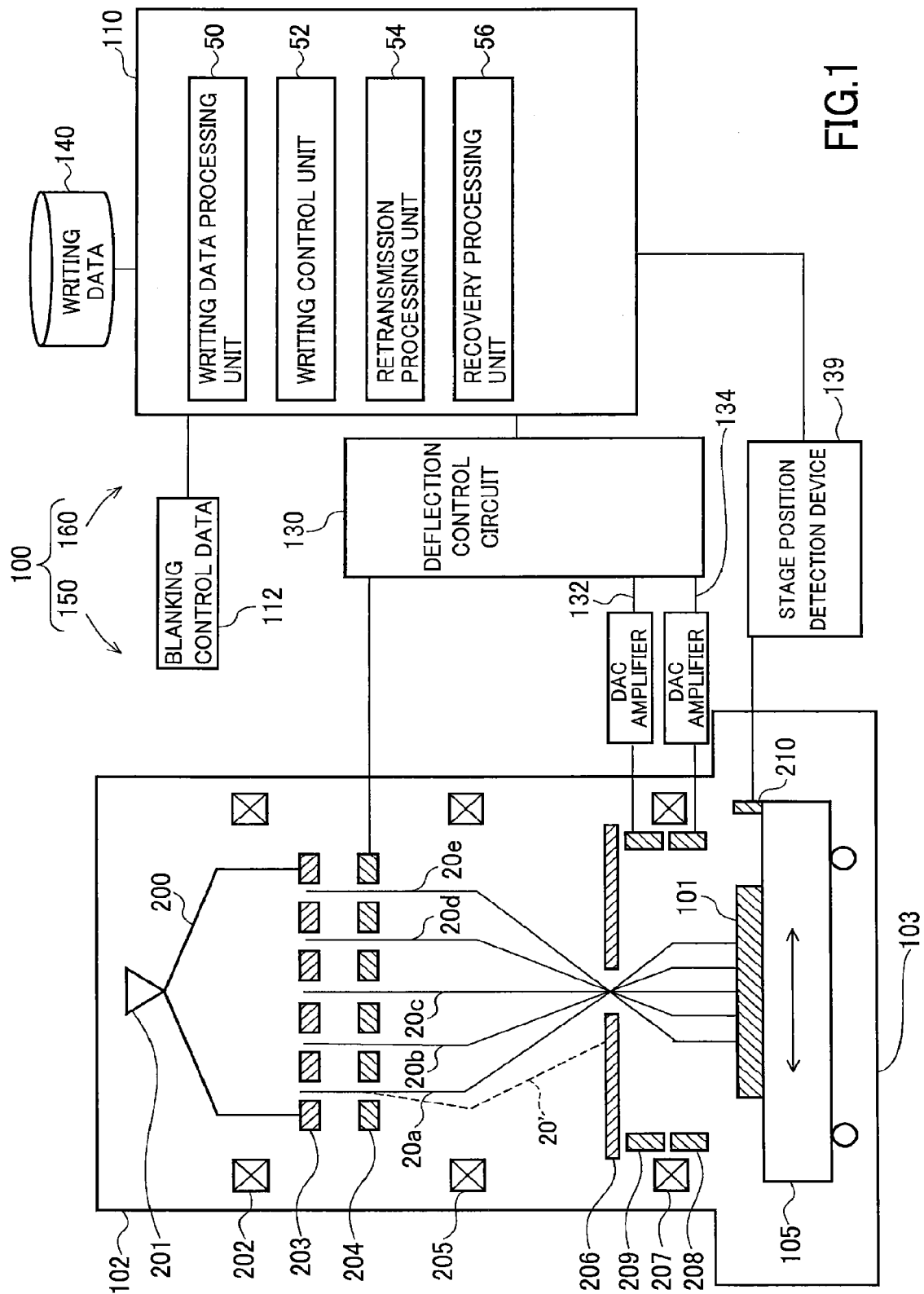
FIG. 1 is a schematic configuration diagram of a writing apparatus according to an embodiment of the present invention.

FIG. 1 is a conceptual diagram illustrating a configuration of a writing apparatus according to the present embodiment. In FIG. 1, a writing apparatus 100 (or "drawing apparatus") includes a writing unit 150 and a control unit 160. The writing apparatus 100 is an example of a multi-charged particle beam writing apparatus. The writing unit 150 includes an electron beam column 102 and a writing chamber 103. An electron gun 201, an illumination lens 202, an aperture member 203, a blanking plate 204, a reduction lens 205, a restricting aperture member 206, an objective lens 207, and deflectors 208 and 209 are provided in the electron beam column 102.

An XY stage 105 is provided in the writing chamber 103. A target object 101 such as a mask, i.e., a substrate on which a pattern is to be written or "drawn", is provided on the XY stage 105. The target object 101 includes, e.g., a mask used for exposure during production of a semiconductor apparatus, or a semiconductor substrate (silicon wafer) with which a semiconductor apparatus is produced. The target object 101 also includes mask blanks to which a photoresist has been applied but to which any pattern has not yet been written. Further, a mirror 210 for detecting the position of the XY stage 105 is provided on the XY stage 105.

The control unit 160 includes a control calculator 110, a memory 112, a deflection control circuit 130, digital-to-analog conversion (DAC) amplifiers 132, 134, a stage position detection device 139, and a storage device 140 such as a magnetic disk apparatus. The control calculator 110, the memory 112, the deflection control circuit 130, the stage position detection device 139, and the storage device 140 are connected to each other via a bus. The storage device 140 receives writing data from the outside, and stores the received writing data. The deflection control circuit 130 is connected to the DAC amplifiers 132, 134. The DAC amplifier 132 is connected to the deflector 209, and the DAC amplifier 134 is connected to the deflector 208.

The control calculator 110 includes a writing data processing unit 50, a writing control unit 52, a retransmission processing unit 54, and a recovery processing unit 56. The function of each unit of the control calculator 110 may be achieved with hardware, or alternatively, achieved with software. When implemented in software, a program that realizes at least part of functions of the calculator 110 may be stored on a recording medium such as a flexible disk or CD-ROM and read and executed by a computer including an electric circuit. Information that is input into and output from the control calculator 110 and information used during computation are stored in the memory 112 on every occasion. The memory 112 stores blanking control data explained later. The blanking control data may be stored in a memory that is different from the memory 112.

Figure 2:
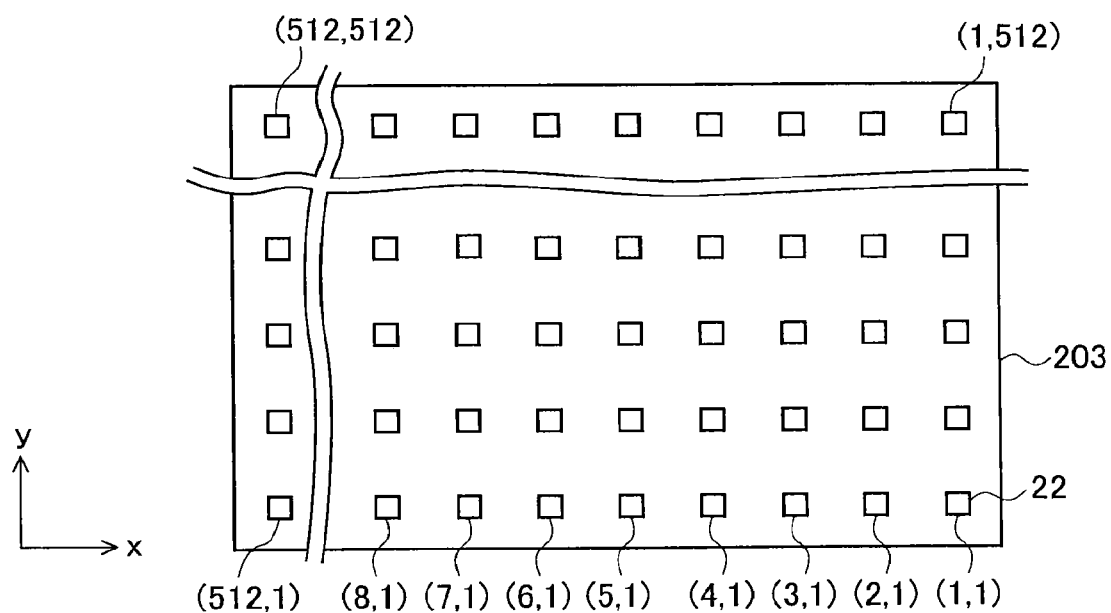
FIG. 2 is a conceptual diagram illustrating a configuration of an aperture member

FIG. 2 is a conceptual diagram illustrating the configuration of the aperture member 203. As illustrated in FIG. 2, in the aperture member 203, holes (opening portions) 22 are formed in m rows in the vertical direction (y direction) and n columns in the horizontal direction (x direction) (m, n≥2) in a matrix form with a predetermined arrangement pitch. In FIG. 2, the holes 22 are formed in 512 rows by 512 columns in the vertical and horizontal directions (y, x directions). Each hole 22 is formed in a rectangular shape having the same dimensions. Alternatively, the holes 22 may have a circular shape having the same external diameter. When part of the electron beam 200 passes through each of the holes 22, multibeams (multiple electron beams) 20a-20e are formed. In this case, for example, the holes 22 are arranged in two or more rows and columns in the vertical and horizontal directions (y, x directions), but the embodiment is not limited thereto. For example, there may be multiple columns or rows in one of the vertical and horizontal directions (y, x directions), and there may be only one column or row in the other of the vertical and horizontal directions (y, x directions). The arrangement of the holes 22 is not limited to the lattice-like arrangement in the vertical and horizontal directions as illustrated in FIG. 2. Alternatively, for example, the holes in the k-th row and the (k+1)-th row in the vertical direction (y direction) may be arranged with a shift in the horizontal direction (x direction).

Figure 3:
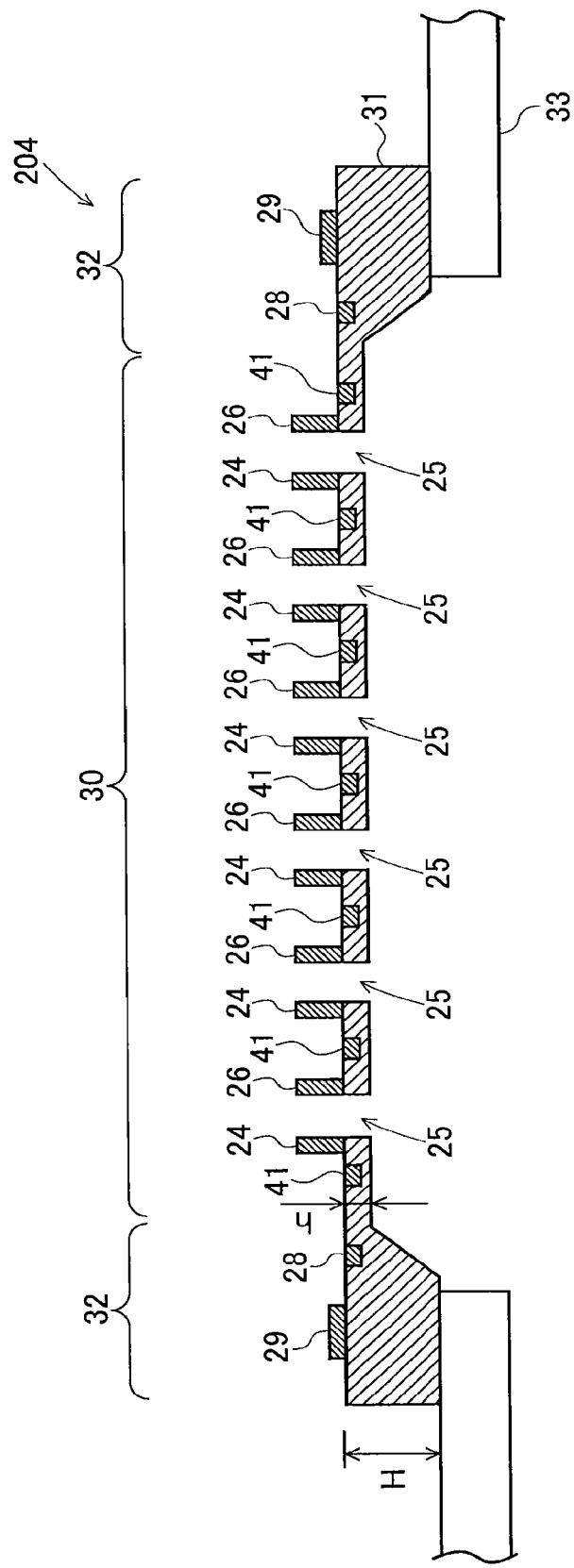
FIG. 3 is a cross sectional view illustrating a configuration of a blanking plate.

FIG. 3 is a cross sectional view illustrating the configuration of the blanking plate 204. As illustrated in FIG. 3, the blanking plate 204 includes a semiconductor substrate 31 made of silicon or the like provided on a support base 33. The central portion of the substrate 31 is ground to be thinner from the back surface side, and is made into a membrane area 30 made with a thin film. The periphery surrounding the membrane area 30 is an external peripheral area 32 made with a thick film. The upper surface of the membrane area 30 and the upper surface of the external peripheral area 32 are formed to be (substantially) flush with each other. At the back surface of the external peripheral area 32, the substrate 31 is held on the support base 33. The central portion of the support base 33 is open, and the membrane area 30 is located above the opening portion of the support base 33.

In the membrane area 30, passage holes 25 (opening portions) are opened at positions respectively corresponding to the holes 22 of the aperture member 203 as illustrated in FIG. 2 so as to allow each beam of the multibeams to pass therethrough. On the membrane area 30, a pair of electrodes 24, 26 (blanker: blanking deflector) for blanking deflection used to deflect the beam are provided in proximity to each of the passage holes 25 in such a manner that the passage hole 25 is interposed between the pair of electrodes 24, 26. In proximity to each of the passage holes 25 in the membrane area 30, a control circuit 41 (logic circuit) is provided to apply the deflection voltage to, for example, the electrode 24 for the passage hole 25. The other of the two electrodes 24, 26 for each beam (for example, the electrode 26) is grounded.

Each of the control circuits 41 is connected to, e.g., wiring for the blanking control data explained later, wiring for the power supply, and wiring for a control clock. The electrodes 24, 26 and the control circuit 41 are provided for each beam constituting the multibeams. An error detection circuit 28 explained later and a pad 29 for transmitting and receiving a signal to and from the outside are provided on the external peripheral area 32.

The electron beam passing through each of the passage holes 25 is independently deflected by the voltage applied from the two electrodes 24, 26. With this deflection, the blanking control is performed. As described above, each of the multiple blankers applies the blanking deflection to the corresponding beam of the multibeams having passed through the multiple holes 22 (opening portions) of the aperture member 203.

Figure 4:
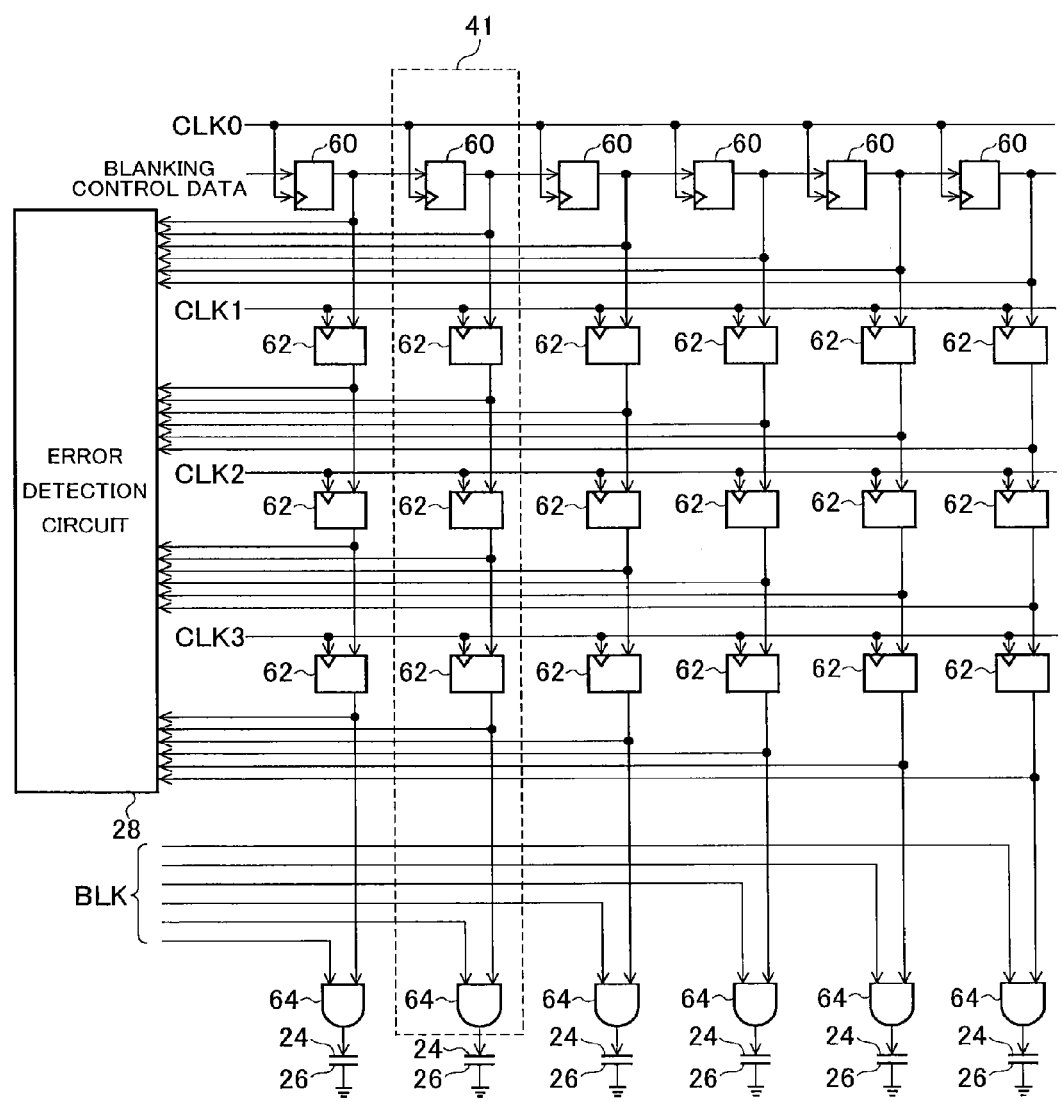
FIG. 4 is a conceptual diagram illustrating an internal configuration of a control circuit.

FIG. 4 is a conceptual diagram illustrating the internal configuration of the control circuit 41. The control circuit 41 is provided for each blanker, and the control circuit 41 includes a first buffer 60, multiple second buffers 62, and a driver 64. On the blanking plate 204, multiple blankers, e.g., multiple blankers arranged in a matrix form, are grouped in such a manner that multiple blankers arranged in the same row or in the same column are made into a single group. In FIG. 4, a single group is constituted by a single line of blankers. The first buffers 60 corresponding to the blankers in the same group are connected in series. The first buffer 60 provided in the first stage receives the blanking control data via the pad 29. The blanking control data is successively transferred to the first buffers 60 at subsequent stages on the basis of a clock signal CLK0.

In the control circuit 41, multiple second buffers 62 connected in series are provided between the first buffer 60 and the driver 64. The second buffer 62 in the first stage receives the output of the first buffer 60. The output of the second buffer 62 in the last stage is input into the driver 64. The blanking control data, which is output from the first buffer 60, is successively transferred through the second buffers 62 in multiple stages on the basis of the clock signals, and the blanking control data is input into the driver 64. FIG. 4 illustrates the configuration in which the second buffers 62 are provided in three stages. In FIG. 4, the blanking control data is successively transferred to subsequent stages on the basis of clock signals CLK1 to CLK3.

The driver 64 is constituted by, for example, an AND gate. With the driver 64, the deflection control voltage is applied to the blanker (electrode 24) on the basis of the blanking control data and the BLK signal (gate signal), so that ON/OFF of the beam is switched. Accordingly, the period of radiation time (the amount of radiation) of the beam is controlled.

The data stored in the first buffer 60 and the second buffers 62 (stored values) are output to the error detection circuit 28 provided in the blanking plate 204. The error detection circuit 28 detects whether there is an error in the data stored in the buffer by performing parity check or calculating the checksum. The error detection circuit 28 detects whether there is a data error in the first buffer 60 and detects in which stage the data error occurs in the second buffer 62, and outputs the detection result to the control calculator 110.

Figure 5:
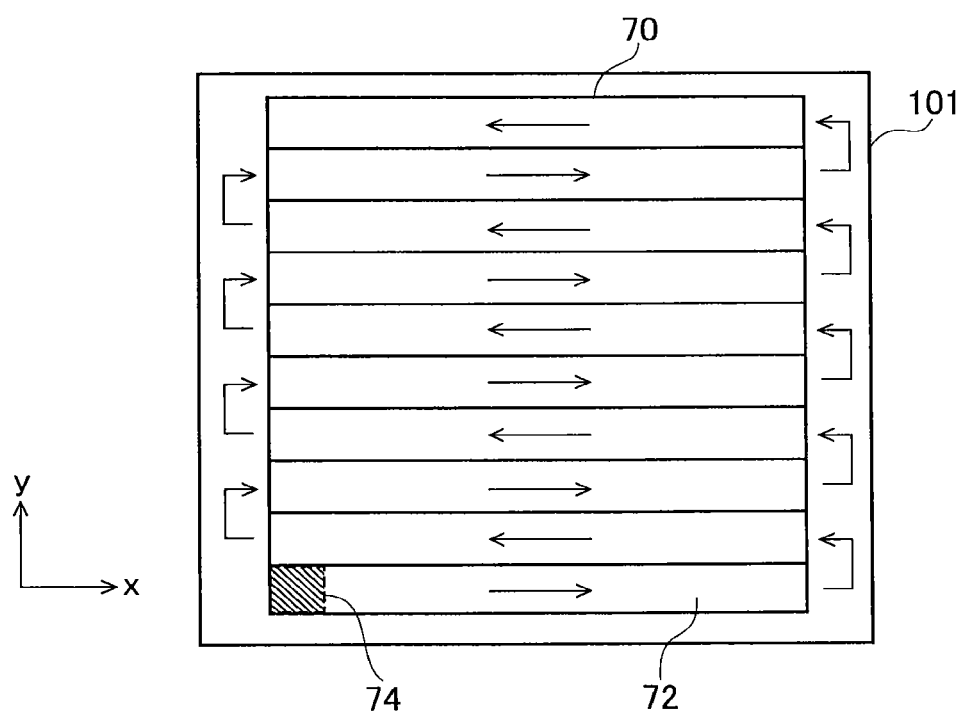
FIG. 5 is a conceptual diagram for explaining an example of a writing operation.

FIG. 5 is a conceptual diagram for explaining an example of a writing operation. As illustrated in FIG. 5, for example, the writing area 70 of the target object 101 is virtually divided into multiple rectangular stripe areas 72 with a predetermined width in the y direction. Each of the stripe areas 72 is a writing unit area. First, the XY stage 105 is moved and adjusted so that an irradiation area 74, to which the multibeams can be radiated with a single radiation, is located at the left end of the first stripe area 72 or at a position at the left side of the left end of the first stripe area 72, and then the writing is started.

When the first stripe area 72 is written, the XY stage 105 is moved, for example, in the −x direction, so that the writing is caused to proceed relatively in the x direction. For example, the XY stage 105 is continuously moved at a constant speed. The moving speed of the XY stage 105 is determined on the basis of the radiation time of the beam and the settling time of the DAC amplifier.

After the first stripe area 72 has been written, the XY stage 105 is moved in the −y direction, so that the irradiation area 74 is adjusted to be located relatively in the y direction at the right end of the second stripe area 72 or at a position at the right side of the right end of the second stripe area 72. Then, the XY stage 105 is moved, for example, in the x direction, so that the writing is likewise performed in the −x direction. The writing can be performed in a shorter period of time by performing the writing while alternately changing the direction, e.g., the writing is performed in the x direction in the third stripe area 72, and the writing is performed in the −x direction in the fourth stripe area 72.

However, the writing may not be necessarily performed while alternately changing the direction as described above. Alternatively, the writing may be performed in the same direction when each of the stripe areas 72 is written. In a single shot, multiple shot patterns up to as many as the number of the holes 22 are formed at a time by the multibeams formed by a beam passing through the holes 22 of the aperture member 203.

Figure 6:
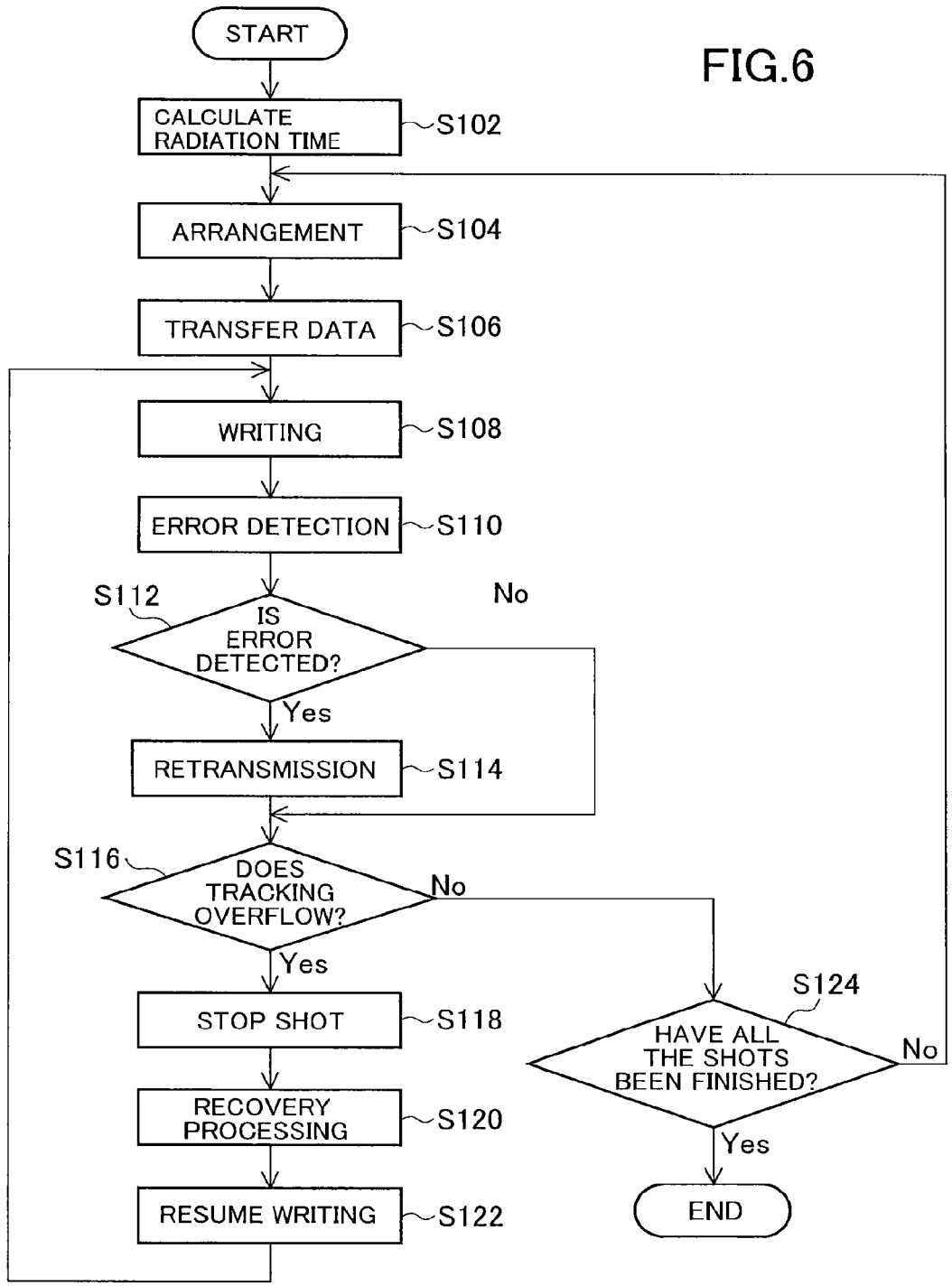
FIG. 6 is a flowchart illustrating steps in a writing method according to the embodiment.

FIG. 6 is a flowchart illustrating important steps in the writing method according to the present embodiment. First, in a radiation time calculation step (S102), the writing data processing unit 50 reads the writing data from the storage device 140, and calculates the area density of a pattern arranged in the inside of each mesh area of multiple mesh areas obtained by virtually dividing the writing area of the target object 101 or the written chip area into a mesh form. For example, first, the writing area of the target object 101 or the written chip area is divided into rectangular stripe areas with a predetermined width. Then, each stripe area is virtually divided into multiple mesh areas explained above. The size of the mesh area is preferably, for example, a beam size, or a size less than the beam size. For example, the size of the mesh area is preferably a size of about 10 nm. Multiple figure patterns defined in the writing data are allocated to the mesh areas, and the area density of the figure pattern arranged in each mesh area is calculated.

Subsequently, the writing data processing unit 50 calculates a radiation time (shot time) T of electron beam per shot for each mesh area of the predetermined size. When multi-level writing is performed, the radiation time T of the electron beam per shot in each hierarchy may be calculated. The radiation time T serving as a reference is preferably derived in proportion to the calculated area density of the pattern. The final calculated radiation time T is preferably a time corresponding to the corrected amount of radiation obtained by correcting, with the amount of radiation, a dimension variation amount with regard to a phenomenon causing dimension variation such as a proximity effect, a fogging effect, a loading effect, or the like, not shown.

Multiple mesh areas defining the radiation time T and multiple mesh areas defining the area density of the pattern may be of the same size, or may be configured in different sizes. In a case where the mesh areas are configured in different sizes, each radiation time T may be derived after the area density is interpolated by linear interpolation or the like. The radiation time T for each mesh area is defined in a radiation time map, and the radiation time map is stored in, for example, a memory 112.

Subsequently, in an arrangement process step (step S104), the writing data processing unit 50 reads the radiation time of the mesh area to which each beam is radiated, and for each row group indicated in FIG. 4 including multiple first buffers 60 connected in series, the writing data processing unit 50 processes the blanking control data corresponding to the radiation times of the beams so that pieces of the blanking control data are arranged in the order according to which the pieces of the blanking control data are transferred by the first buffer 60. The arrangement process is performed so that, in the group of multiple first buffers 60 connected in series, the data for the first buffer 60 in the downstream stage is arranged first in the blanking control data.

In a data transfer step (step S106), for each shot of the beam, the writing control unit 52 outputs, to the deflection control circuit 130, the blanking control data which is processed in a sequence for the group of multiple first buffers 60 connected in series, and stores the blanking control data in the memory 112. An error detection symbol such as a parity bit is added to the output blanking control data. For each shot, the deflection control circuit 130 outputs the blanking control data to the first stage of the first buffers 60 connected in series. On the basis of a command given by the writing control unit 52, the deflection control circuit 130 outputs the clock signals CLK0 to CLK3 for data transfer.

As illustrated in FIG. 4, the first buffer 60 transfers the blanking control data to the first buffer 60 in the downstream stage on the basis of the clock signal CLK0. After the blanking control data is transferred to the first buffer 60 in the last stage, the data stored in the first buffer 60 is stored in the second buffer 62 in the first stage in the same control circuit 41 on the basis of the clock signal CLK1.

Thereafter, on the basis of the clock signals CLK2, CLK3, the blanking control data is transferred to the second buffers 62 in the downstream stage. The second buffers 62 in the same stage store the blanking control data corresponding to the same shot. The driver 64 applies a voltage to the electrode 24 of the blanker on the basis of the blanking control data stored in the second buffer 62 in the last stage. Accordingly, the beam can be turned ON during the radiation time indicated by the blanking control data.

In a writing step (step S108), tracking control based on beam deflection is performed so as to cause the writing positions of the beams of the multibeams to collectively follow the movement of the XY stage 105. More specifically, the stage position detection device 139 radiates a laser beam to the mirror 210 and receives the reflected light from the mirror 210, thus determining the position of the XY stage 105. The determined position of the XY stage 105 is output to the control calculator 110. In the control calculator 110, the writing control unit 52 outputs the position information about the XY stage 105 to the deflection control circuit 130. In the deflection control circuit 130, deflection quantity data (tracking deflection data) is calculated to provide beam deflection so as to follow the movement of the XY stage 105 in accordance with the movement of the XY stage 105. The tracking deflection data, i.e., a digital signal, is output to the DAC amplifier 134. The DAC amplifier 134 converts the digital signal into an analog signal, and then, the DAC amplifier 134 amplifies the analog signal and applies it to the deflector 208 as a tracking deflection voltage.

While the writing unit 150 performs the tracking control based on the beam deflection so as to cause the writing positions of the beams of the multibeams to collectively follow the movement of the XY stage 105, the writing unit 150 radiates the beams corresponding to the ON beams of the multibeams 20a-20e to the writing positions of the beams for the respectively corresponding writing times within the maximum writing time defined in advance. More specifically, the operation is performed as follows.

The electron beam 200 emitted from the electron gun 201 (discharge unit) substantially vertically illuminates the entire aperture member 203 with the illumination lens 202. Multiple rectangular holes (opening portions) are formed in the aperture member 203, and the electron beam 200 illuminates the area including all the multiple holes 22. A part of the electron beam 200 radiated to each of the positions of the multiple holes 22 passes through the corresponding hole 22 of the aperture member 203, so that, for example, multibeams (multiple electron beams) 20a-20e in a rectangular shape are formed. The multibeams 20a-20e pass through the inside of the corresponding blankers of the blanking plate 204. Such blankers individually switch ON/OFF of the multibeams 20a-20e on the basis of the blanking control data and the BLK signal (the gate signal).

The multibeams 20a-20e having passed through the blanking plate 204 are reduced by the reduction lens 205, and proceeds toward the central hole formed in the restricting aperture member 206. In this case, the position of each of the electron beams 20a-20e deflected to be the OFF beam by the blanker of the blanking plate 204 is deviated from the central hole of the restricting aperture member 206 (the blanking aperture member), and the deflected electron beam 20' is shielded by the restricting aperture member 206. On the other hand, the electron beams 20a-20e deflected to be the ON beam by the blanker of the blanking plate 204 passes through the central hole of the restricting aperture member 206 as illustrated in FIG. 1.

As described above, the restricting aperture member 206 shields each beam deflected to be in the OFF state by the individual blanking mechanism. A beam for a single shot is formed by a beam having passed through the restricting aperture member 206 that is formed from ON to OFF of the beam.

The multibeams 20a-20e having passed through the restricting aperture member 206 are focused by the objective lens 207 to be made into a pattern image with a desired reduction ratio, and the beams (the multibeams 20a-20e) having passed through the restricting aperture member 206 are collectively deflected by the deflector 209 in the same direction, and each beam is radiated to the corresponding writing position (irradiation position) on the target object 101 for each beam. For example, while the XY stage 105 moves continuously, the deflector 208 performs the tracking control so that the writing position (the irradiation position) of the beam follows the movement of the XY stage 105.

An area in which the beam can be deflected by the deflector 209 is a main deflection area, and the deflector 208 performs tracking control to control the positions of multiple shots while following the movement of the XY stage 105 in this main deflection area. When all the shots in a single main deflection area are finished, the tracking processing of the XY stage 105 is stopped. Then, when the position of a subsequent main deflection area is determined, the tracking processing is started again, and the positions of multiple shots are controlled while following the movement of the XY stage 105.

The range that can be tracked by the deflector 208 is limited, and all the shots in a single main deflection area are required to be finished within the trackable range. The stage speed is determined according to the trackable range, the number of shots in the main deflection area, the shot time, and the settling time of the DAC amplifier 134.

Ideally, the multibeams 20a-20e radiated at a time are arranged with a pitch obtained by multiplying the arrangement pitch of the multiple holes of the aperture member 203 by the desired reduction ratio explained above. The writing apparatus 100 performs writing according to a method for radiating the shot beams in order while shifting the writing position. When a desired pattern is written, a beam required for the pattern is controlled to be the ON beam by the blanking control.

When a single shot is finished, the data stored in the second buffer 62 in the second stage is stored in the second buffer 62 of the last stage (the third stage) on the basis of the clock signal CLK3. A subsequent shot is performed by using the blanking control data stored in the second buffer 62 in the last stage.

When the data stored in the second buffer 62 in the second stage is stored in the second buffer 62 in the third stage, the data stored in the second buffer 62 in the first stage is stored in the second buffer 62 in the second stage on the basis of the clock signal CLK2 during writing (during beam radiation).

When the data stored in the second buffer 62 in the first stage is stored in the second buffer 62 in the second stage, the data stored in the first buffer 60 is stored in the second buffer 62 in the first stage on the basis of the clock signal CLK1.

The data stored in the first buffer 60 is stored in the second buffer 62 in the first stage, further, blanking control data for a subsequent shot is output from the deflection control circuit 130, and the banking control data is successively transferred to the first buffers 60 in order on the basis of the clock signal CLK0.

As described above, during writing (during beam radiation), pieces of blanking control data for subsequent and later shots are transferred and stored in the second buffers 62 in multiple stages, so that the delay caused by the data transfer is reduced, and the blanking control can be performed at a high speed.

The writing control unit 52 monitors to what extent the output blanking control data is transferred on the basis of the clock signals CLK0 to CLK3, and more specifically, the writing control unit 52 monitors for which shot the blanking control data is stored in the first buffer 60 and the second buffer 62 in each stage on the basis of the clock signals CLK0 to CLK3. The writing control unit 52 removes the blanking control data of the finished shot from the memory 112. Therefore, the memory 112 can be used efficiently.

In the error detection step (step S110), the error detection circuit 28 reads the stored values in the first buffer 60 and the second buffer 62 in each stage and performs error detection of the blanking control data for each shot by performing the parity check or calculating the checksum.

When an error is detected (step S112, Yes), the retransmission processing of the blanking control data is performed (step S114), and the retransmission processing unit 54 retrieves, from the memory 112, the blanking control data having the error detected therein and the blanking control data for the subsequent and later shots, and retransmits the retrieved blanking control data.

An example of data retransmission processing is illustrated in FIG. 7 to FIG. 11. In FIG. 7 to FIG. 11, for the sake of explanation, the error detection circuit 28, a signal line to the error detection circuit 28, and a signal line for the BLK signal are not illustrated in the drawings.

Figure 7:
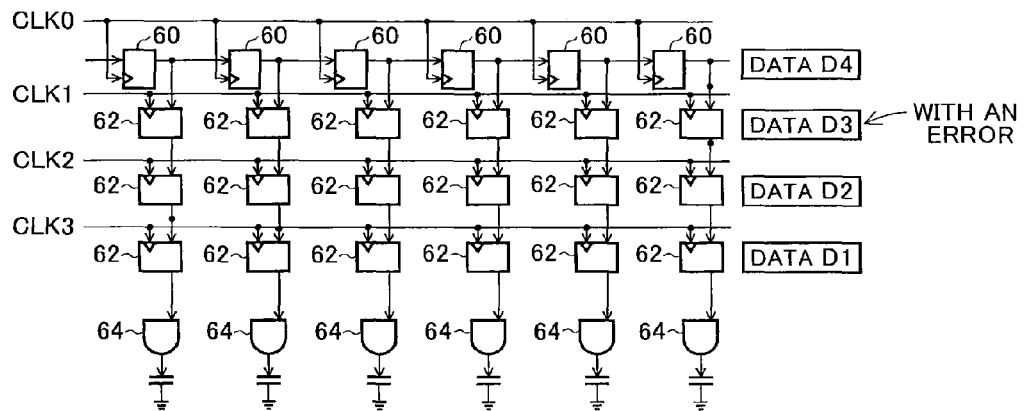
FIG. 7 is an illustration of an example of data retransmission processing.

The following case will be considered: for example, as illustrated in FIG. 7, when pieces of blanking control data DI to D4 (which may be hereinafter referred to simply as "data DI to data D4") are output in order, and are transferred to the first buffer 60 and the second buffers 62 in order, an error is detected in the data D3 stored in the second buffer 62 in the first stage.

Figure 8:
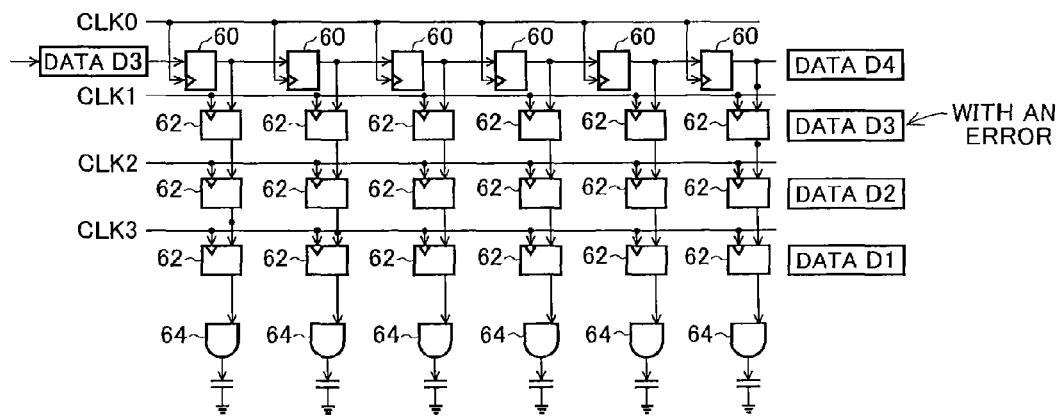
FIG. 8 is an illustration of an example of data retransmission processing.

In this case, the retransmission processing unit 54 retrieves the data D3, which is to be stored in the second buffer 62 in the first stage, from the memory 112, and retransmits the data D3 to the blanking plate 204. As illustrated in FIG. 8, the retransmitted data D3 is transferred through the first buffers 60 in order. When the data D3 has been transferred to the first buffer 60 in the last stage, the data D3 is transferred from the first buffer 60 to the second buffer 62 in the first stage.

Figure 9:
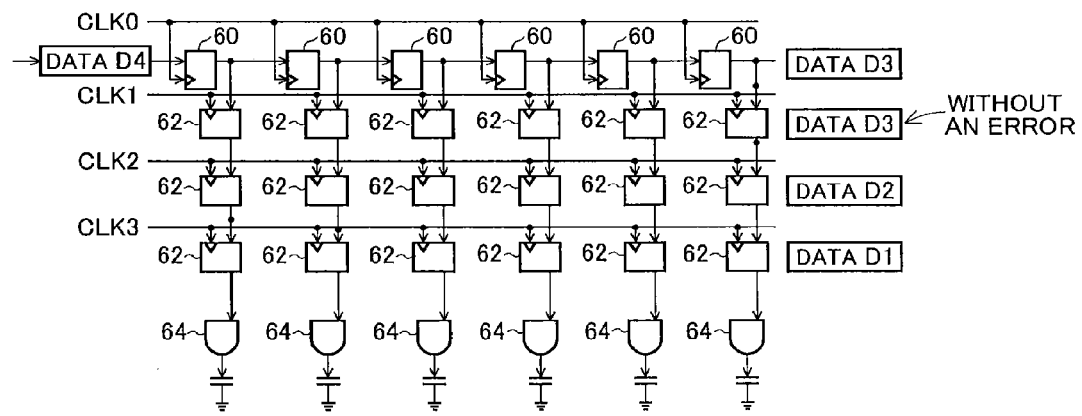
FIG. 9 is an illustration of an example of data retransmission processing.

When the correct data D3 has been transferred to the second buffers 62 in the first stage, the retransmission processing unit 54 retransmits the data D4 corresponding to a shot subsequent to the data D3 as illustrated in FIG. 9. The blanking plate 204 according to the present embodiment is configured so that data is transferred in order through the first buffer 60 and the second buffers 62, and it is necessary to retransmit not only the data in which an error has been detected, but also data for subsequent and later shots.

Figure 10:
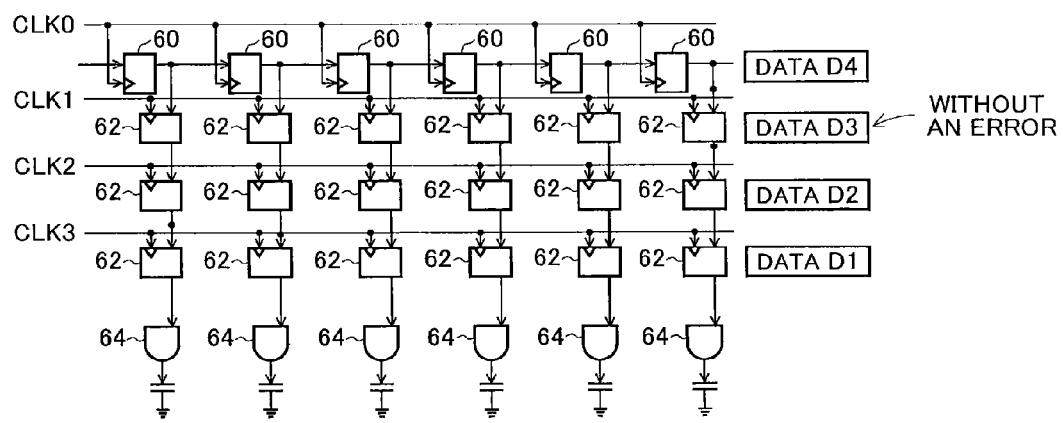
FIG. 10 is an illustration of an example of data retransmission processing.

The retransmitted data D4 is successively transferred through the first buffers 60, so that the correct data is stored in all the buffers of the blanking plate 204 as illustrated in FIG. 10.

Figure 11:
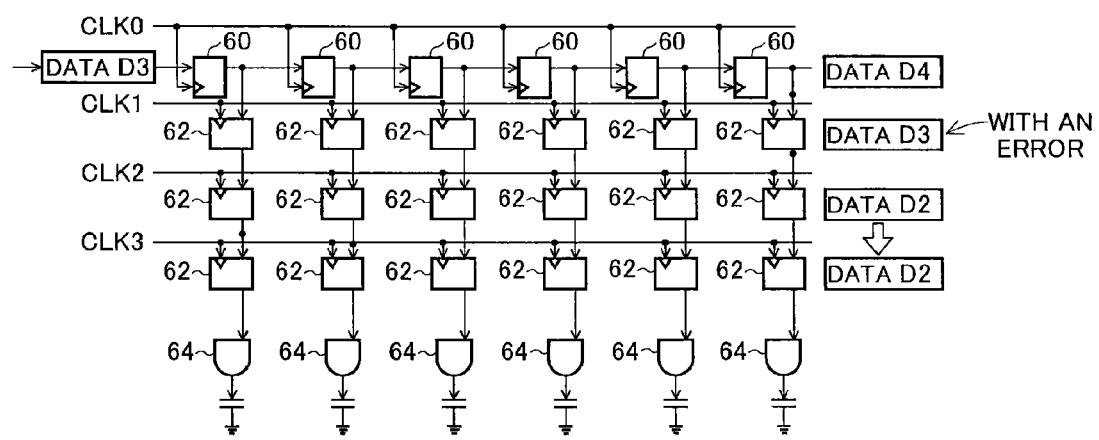
FIG. 11 is an illustration of an example of data retransmission processing.

In a case where the shot for the data D1 has been finished during retransmission processing of the data D3 and data D4, the data D2 is transferred from the second buffer 62 in the second stage to the second buffer 62 in the third stage as illustrated in FIG. 11, and a subsequent shot is performed. Therefore, even when data retransmission is performed due to occurrence of a data transfer error, the writing processing is not affected.

However, for example, in a case where the data in which an error has been detected is data stored in the second buffer 62 at a downstream stage, and it takes some time to store the retransmitted data to be stored in the intended second buffer 62, all the shots in the main deflection area cannot be completed within the trackable range, and the tracking overflows, which may make it impossible for the deflector 208 to deflect the beam to the desired writing position. As described above, in a case where the tracking overflows, it is necessary to stop the shot in advance, and perform recovery processing to return the stage position.

The writing control unit 52 divides the remaining trackable amount by the stage speed to calculate the time to reach the limit of the tracking (tracking limitation arrival time), and compares this tracking limitation arrival time with a time required to perform the stop processing for stopping the shot. In this case, the time required to perform the stop processing for stopping the shot is a time obtained by adding a reference shot time, a transmission delay time from when a shot stop signal is output to when the shot is actually stopped, and a margin. The reference shot time is the maximum radiation time for a single shot, or a time that has been set specifically.

In a case where the tracking limitation arrival time becomes equal to or less than the time required to perform the stop processing for stopping the shot while the shot in the main deflection area has not yet been finished, the tracking is determined to overflow (step S116, Yes), and the writing control unit 52 outputs a shot stop signal (step S118).

In a case where the recovery processing unit 56 receives a shot stop completion signal, or in a case where the time required to perform the stop processing for stopping the shot has passed since the shot stop signal is output, the recovery processing is performed (step S120).

In the recovery processing step, the recovery processing unit 56 outputs a command to return the stage position back to the designation position. For example, an approach run distance required to attain the movement speed of the XY stage 105 in the writing process is derived on the basis of the acceleration of the XY stage 105, and the XY stage 105 is returned to the position where this approach run distance can be ensured. Then, the recovery processing unit 56 causes movement of the XY stage 105 to start again from this designation position. When the movement speed of the XY stage 105 attains a predetermined speed, and the target object 101 on the XY stage 105 arrives at a position where pattern writing can be performed, the writing processing is resumed (step S122).

When the writing processing is resumed, the deflection control circuit 130 calculates the tracking deflection data again, and outputs the tracking deflection data to the DAC amplifier 134. In a case where the change in the deflection sensitivity of the deflector 209 is small, the calculation of the deflection data for the deflector 209 may be omitted. In a case where the change in the deflection sensitivity of the deflector 209 is large, the deflection control circuit 130 performs deflection calculation by using the blanking control data stored in the memory 112, and outputs the deflection data to the DAC amplifier 132.

In a case where the tracking overflows when such recovery processing is performed, the writing processing is interrupted, and the position of the XY stage 105 is returned, and thereafter, the writing processing can be resumed normally.

The writing control unit 52 determines whether all the shots have been finished or not. In a case where all the shots are determined to have been finished (step S124, Yes), the writing control unit 52 terminates the writing processing, and in a case where all the shots are determined not to have been finished (step S124, No), the writing control unit 52 returns back to the arrangement process step (step S104).

As described above, according to the present embodiment, buffers are provided in multiple stages for each blanker, so that the blanking control data is transmitted successively. During writing (during beam radiation), the blanking control data for subsequent and later shots can be transferred, and therefore, this can suppress the delay caused by the data transfer, and the blanking control can be performed at a high speed.

A detection operation is performed to determine whether or not an error is included in the data stored in each buffer, and in a case where a data transfer error is determined to have occurred, the correct data is retransmitted. Therefore, ON/OFF of the beam can be correctly controlled, and a deterioration in the writing precision can be suppressed, and the occurrence of a pattern error can be prevented. This data retransmission is performed during writing (during beam radiation) and thereby the writing processing can be performed without being affected by the retransmission.

In the present embodiment, after the data retransmission, whether the tracking overflows or not is determined on the basis of the remaining trackable amount during the writing processing, the stage speed, and the time required to perform the stop processing for stopping the shot, and in a case where the tracking overflows before the shots in the main deflection area have been finished, the shot is stopped, and the recovery processing is performed. Then, after the position of the XY stage 105 is returned, the movement of the XY stage 105 is resumed, and when the target object 101 enters the pattern writing possible area, the writing is resumed. Therefore, this can prevent the tracking from overflowing.

In the explanation about FIG. 4, for example, the second buffers 62 are provided in three stages. Alternatively, second buffers 62 may be provided in two stages, or may be provided in four or more stages. The second buffers 62 are preferably provided in three or more stages, so that the writing processing is not affected even when data retransmission is performed due to occurrence of a data transfer error.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-charged particle beam writing apparatus comprising:
a stage on which a target object is placed and which can continuously move;
a discharger discharging a charged particle beam;
an aperture member having a plurality of opening portions formed therein and configured to receive radiation of the charged particle beam in an area including all of the plurality of opening portions and to form multibeams when part of the charged particle beam passes through each of the plurality of opening portions;
a blanking plate arranged with a plurality of blankers applying a blanking deflection for switching ON/OFF of corresponding beams among the multibeams having passed through the plurality of opening portions of the aperture member;
a deflector deflecting the beams having passed through the blankers to a waiting position of each beam by following movement of the stage;
a control processing circuitry generating, for each beam, blanking control data for switching ON/OFF of the beam for each of a plurality of shots, transmitting the blanking control data to the blanking plate, and controlling the deflector so that each beam is deflected to a corresponding waiting position; and
a memory storing the blanking control data transmitted to the blanking plate,
wherein the blanking plate includes a plurality of first buffers corresponding to the blankers and connected in series with each other:
second buffers in a plurality of stages connected in series with each other between one of the first buffers and a driver of a blanker corresponding to the one of the first buffers;
an error detection processing circuitry performing error detection on data stored in the one of the first buffer buffers and the second buffer in each of the stages,
wherein the blanking control data is configured to be transferred to the corresponding blanker via the one of the first buffers and the second buffers, and
in a case where the error detection processing circuitry detects an error, the control processing circuitry retransmits the blanking control data to the blanking plate with regard to a shot having the error detected therein and a shot which comes, in a shot order, after the shot having the error detected therein.

2. The apparatus according to claim 1, wherein the control processing circuitry monitors to which of the first buffer or stages of the second buffers in the plurality of stages the blanking control data for each shot has been transferred.

3. The apparatus according to claim 1, wherein in parallel with the retransmission of the blanking control data, writing is performed with regard to a shot which comes, in the shot order, before the shot having the error detected therein.

4. The apparatus according to claim 1, wherein the control processing circuitry erases blanking control data for a finished shot from the memory.

5. The apparatus according to claim 1, wherein in a case where the control processing circuitry determines that the deflector is unable to deflect the beam to a predetermined writing position, the control processing circuitry interrupts the writing and performs recovery processing to return a stage position.

6. The apparatus according to claim 5, wherein when the writing is resumed after the recovery processing, the blanking control data is used to calculate again deflection data for the deflector.

7. The apparatus according to claim 1, wherein the second buffers in three or more stages are connected in series.

8. A multi-charged particle beam writing method comprising:
outputting, for each beam of multibeams of a charged particle beam, blanking control data for switching ON/OFF of the beam for each of a plurality of shots to a blanking plate;
successively transferring the blanking control data through a plurality of first buffers corresponding to blankers and connected in series with each other and through second buffers in a plurality of stages connected in series with each other between one of the first buffers and a driver of a blanker corresponding to the one of the first buffers;
causing the blanker to switch ON/OFF of the beam on the basis of the blanking control data transferred via the one of the first buffers and the second buffers;
performing error detection on data stored in the one of the first buffers and the second buffer in each of the stages; and
retransmitting the blanking control data to the blanking plate with regard to a shot in which an error has been detected and a shot which comes, in a shot order, after the shot having the error detected therein in a case where the error is detected.

9. The method according to claim 8, wherein monitoring is performed to find to which of the first buffer or stages of the second buffers in the plurality of stages the blanking control data for each shot has been transferred.

10. The method according to claim 8, wherein in parallel with the retransmission of the blanking control data, writing is performed with regard to a shot which comes, in the shot order, before the shot having the error detected therein.

11. The method according to claim 8, wherein the blanking control data having been transmitted to the blanking plate is stored in a memory, and blanking control data for a finished shot is erased from the memory.

12. The method according to claim 8, wherein a deflector is used to deflect the beams having passed through the blankers to a predetermined writing position by following movement of the stage on which a target object is placed, and in a case where it is determined that the beam cannot be deflected to the predetermined writing position, the writing is interrupted, and recovery processing for returning a stage position is performed.

13. The method according to claim 12, wherein when the writing is resumed after the recovery processing, the blanking control data is used to calculate again deflection data for the deflector.

* * * * *